United States Patent [19]

Fink et al.

[11] 4,050,014

[45] Sept. 20, 1977

[54] CIRCUIT ARRANGEMENT FOR MEASURING THE PHASE MODULATION DISTURBANCE OF A TEST SIGNAL

[75] Inventors: Helmuth Fink, Munich; Güenter Wess, Oberalting-Seefeld, both of Germany

[73] Assignee: Siemens Aktiengesellschaft, Berlin & Munich, Germany

[21] Appl. No.: 665,500

[22] Filed: Mar. 10, 1976

[30] Foreign Application Priority Data

Mar. 14, 1975 Germany ............................ 2511323

[51] Int. Cl.[2] .............................................. G01R 27/00
[52] U.S. Cl. .................................................. 324/57 H
[58] Field of Search ............................ 324/57 H, 57 R

[56] References Cited

U.S. PATENT DOCUMENTS

| 3,414,809 | 12/1968 | Hoffmann et al. | 324/57 H |
| 3,818,331 | 6/1974 | Schlosser | 324/57 R |
| 3,818,332 | 6/1974 | Schlosser | 324/57 R |

*Primary Examiner*—Stanley T. Krawczewicz
*Attorney, Agent, or Firm*—Hill, Gross, Simpson, Van Santen, Steadman, Chiara & Simpson

[57] ABSTRACT

A circuit arrangement for measuring the phase modulation disturbance of a test signal which is passed through a test object and wherein a heterodyne oscillator supplies an input to a mixer which receives the input signal and supplies an output to a detector and display device and wherein the output of the mixer is applied to an automatic frequency control loop including a reference oscillator phase discriminator and a low pass filter which supplies an input to the frequency control input of the heterodyne oscillator.

10 Claims, 1 Drawing Figure

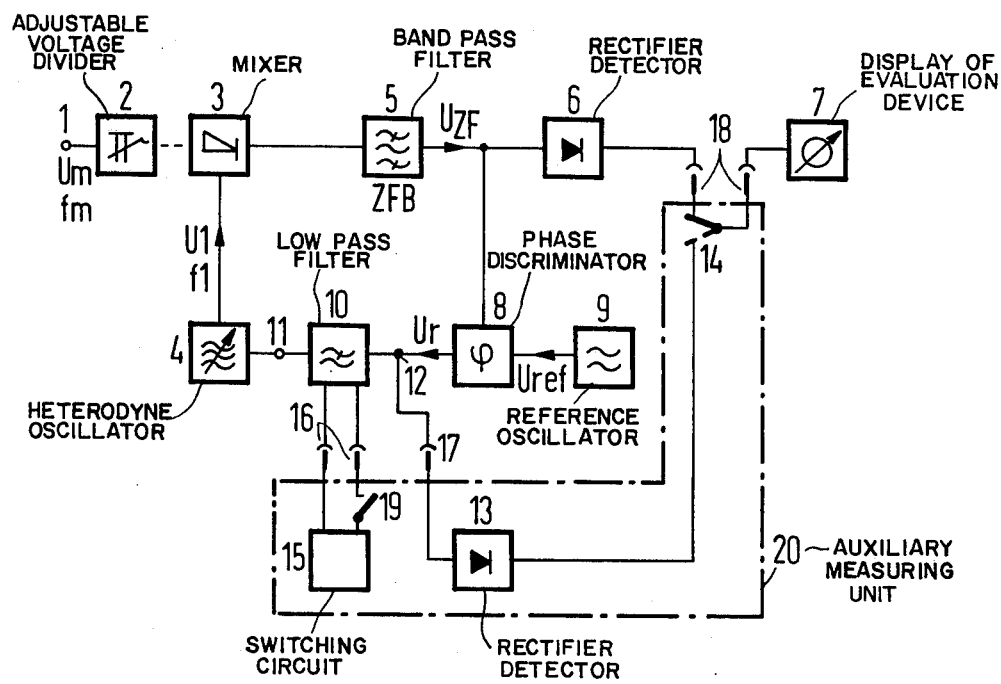

[4,050,014]

CIRCUIT ARRANGEMENT FOR MEASURING THE PHASE MODULATION DISTURBANCE OF A TEST SIGNAL

BACKGROUND OF THE INVENTION

1. Field of the Invention

This invention relates in general to circuits for determining the phase modulation disturbances in a signal which is passed through a test object.

2. Description of the Prior Art

Phase-jitter has previously been measured at measuring points which lie in the range of the carrier frequency operated portions or stages of a carrier-frequency transmission system and the signal being measured is picked up and converted with a carrier frequency heterodyne receiver of a level measuring apparatus and is converted into the original frequency position and fed in at the low frequency input and then is evaluated by means of a "phase-jitter" measuring apparatus operating in the low frequency range. Such prior art systems require in addition to the conventional apparatus expensive apparatus and numerous operating stages and settings of the interconnected devices which makes the measurement time consuming, complicated and expensive.

SUMMARY OF THE INVENTION

It is an object of the present invention to provide measuring the phase modulation disturbance of a test signal in the carrier frequency range in a simple manner and with the use of less circuit and equipment than has previously been required. The invention utilizes a phase discriminator which receives an IF signal into which the test signal has been converted by the use of a heterodyne oscillator and the output of the discriminator controls the frequency of the heterodyne oscillator as a function of the phase difference between the test signal being measured and a reference signal supplied from a reference oscillator. The test signal is first converted into the IF band before being supplied to the phase discriminator. A display or evaluation device receives the output IF signal to measure and indicate the amplitude or phase of the test signal.

The advantages of the present invention is that it eliminates the "phase-jitter" measuring apparatus which has previously been necessary in addition to the carrier frequency heterodyne receiver. The frequency control circuit of the carrier frequency heterodyne receiver are utilized to accomplish the same results as the previously used "phase-jitter" measuring apparatus. If desired, an inexpensive auxiliary measuring unit can be used. For example, a transmission level display device connected to the carrier frequency heterodyne receiver can also be used for displaying the phase modulation disturbance.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIF DESCRIPTION OF THE DRAWINGS

The drawing is a block diagram of the novel circuit arrangement for determining the phase modulation disturbance in a test signal.

DESCRIPTION OF THE PREFERRED EMBODIMENTS

An input terminal 1 receives the input signal which is to be measured and which comprises a frequency modulated signal $U_m$. The input terminal is connected to an adjustable voltage divider 2 which supplies an output to a mixer 3 which also receives an input from a heterodyne oscillator 4 at a frequency $f1$. This signal is designated U1. A band pass filter 5 receives the output of the mixer 3 and has a pass band defining an intermediate frequency band ZFB and passes the converted signal UZF. The output of the band pass filter 5 is supplied to a detector-rectifier 6 which supplies its output through contacts 18 and a switch 14 to a display or evaluation device 7 which measures and indicates the amplitude or phase of the input signal $U_m$. These measurements can be used for transmission level measurements and the circuit can also be designated as a selective carrier-frequency transmission level meter or measuring device.

Carrier frequency heterodyne receivers of the type described generally have automatic frequency control circuits which become operational after an adjustment to fm is achieved by tuning the output of the oscillator 4 to $f1$ or by corresponding tuning of other heterodyne oscillators not shown in detail and the frequency control circuit maintains the receiver automatically tuned during minor fluctuations of the FM signal. For this purpose, the signal being measured after it has been converted to IF UZF is supplied to a phase discriminator 8 which receives a second input from a reference oscillator 9. The output of the reference oscillator 9 is designated as Uref. The frequency of Uref corresponds to the desired or nominal value of the frequency $U_{ZF}$ and has a constant phase which serves as a reference phase in the control loop of the automatic control system.

The output of the phase discriminator 8 depends on the phase difference between the voltage $U_{ZF}$ and the reference signal from reference oscillator 9 designated Uref and the output of the phase discriminator 8 consists of a voltage Ur which is applied to a low pass filter 10 and then supplied at the output of the low pass filter 10 to the frequency control input terminal 11 of the heterodyne oscillator 4. The voltage Ur adjusts the frequency $f1$ of the heterodyne oscillator 4 so that the frequency $U_{ZF}$ nearly always coincides with its nominal desired value and thus always lies in the middle of the pass band of the band pass filter 5.

The output of the phase discriminator Ur is an accurate measurement of the phase disturbance of the signal $U_m$ which has been caused by passing through the test object. The output of the phase discriminator 8 is applied to terminal 12 and can be evaluated by a display or evaluation device by passing it through a terminal 17 and a detector rectifier 13 which has an output terminal connected to a terminal of switch 14 which has a movable contact that can connect the display device 7 to the output of the detector rectifier 13. This allows the display or evaluation device 7 to be connected to either the output of the detector rectifier 6 or the detector rectifier 13.

For purposes of automatic frequency control the cut-off frequency of the low pass filter 10 should be set as high as possible so that the maximum speed of frequency alterations of $fm$ which can be adjusted via the frequency control circuit is also as high as possible. For the measurement of the phase disturbance modulation of U$m$ on the other hand, it is desirable to set the cut-off frequency of the low pass filter 10 low enough so that the low frequency phase disturbance modulations which, for example, can result from line voltages or 20 hertz calling voltages can also be detected. Therefore, it is advantageous to construct the low pass filter 10 so that it can be switched to different cut-off frequencies. This can be done, for example, by the use of alternative switching circuit member 15 that can be connected with plug-in connections 16 to the low pass filter 10 to various frequency response and particularly its cut-off frequency at the high/low frequency end. Plug-in connections 17 can be used to connect the detector rectifier 13 to the output of the phase discriminator 8. Plug-in connections 17 and 18 can be used to connect the switch 14 between the detector rectifier 6 and the display 7.

It is desirable to place a switch 19 between the switching circuit member 15 and the low pass filter so as to selectively connect the switching circuit member 15 to the low pass filter 10 for changing its pass band characteristics.

A preferred further modification of the invention provides that the switching circuit member 15, the switches 14 and 19 and the detector rectifier 13 can be mounted together in an auxiliary measuring unit 20 which can be connected by the plug-in connections 16, 17 and 18 of the carrier frequency heterodyne receiver.

Although this invention has been described with respect to preferred embodiments it is not to be so limited as changes and modifications may be made which are within the full intended scope of the invention as defined by the appended claims.

We claim as our invention:

1. A circuit for detecting phase modulation disturbances of a signal, which has passed through a test object, in the carrier-frequency band comprising a carrier-frequency selective heterodyne receiver comprising a mixer receiving the incoming signal after it has passed through said test object, a band pass filter receiving the output of said mixer and passing an I.F. frequency, a voltage tunable heterodyne oscillator supplying an input to said mixer, a reference oscillator, a phase discriminator receiving a portion of said I.F. frequency and the output of said reference oscillator and producing an output voltage which is supplied to said voltage tunable heterodyne oscillator to adjust the frequency of said heterodyne oscillator, a first detector receiving a portion of the I.F. output of said band pass filter, and an evaluation device receiving the output of said first detector.

2. A circuit according to claim 1 including a low pass filter connected between said phase discriminator and said voltage tunable heterodyne oscillator and said low pass filter passing low frequency phase modulation disturbance frequencies.

3. A circuit according to claim 2 including a switching circuit member connected to said low pass filter for selectively changing its pass band.

4. A circuit arrangement according to claim 3 comprising a second detector connectible to the output of said phase discriminator and switching means connected to said second detector and said switching means disconnecting the output of said first detector from said evaluation device and connecting said second detector to said evaluation device.

5. A circuit arrangement according to claim 1 wherein said evaluation device is a display means which displays the transmission-level for indicating phase modulation disturbances.

6. A circuit for detecting phase modulation disturbances of a signal, which has passed through a test object, in the carrier-frequency band comprising a carrier-frequency selective heterodyne receiver comprising a mixer receiving the incoming signal after it has passed through the test object, a band pass filter receiving the output of said mixer and producing an I.F. frequency, a voltage tunable heterodyne oscillator supplying an input to said mixer, a reference oscillator, a phase discriminator receiving the output of said reference oscillator and a portion of said I.F. frequency from said band pass filter and producing an output voltage which is supplied to said voltage tunable heterodyne oscillator to adjust its frequency, a first detector receiving a portion of the output of said band pass filter, and an evaluation device receiving the output of said first detector.

7. A circuit according to claim 6 including a low pass filter connected between said phase discriminator and said voltage tunable heterodyne oscillator and said low pass filter passing low frequencies such that low phase modulation disturbance frequencies are supplied to said evaluation device.

8. A circuit according to claim 7 including switching circuit means connected to said low pass filter to change its pass band from a first pass band frequency for use during frequency control to a lower pass band frequency for use during phase modulation disturbance measurements.

9. A circuit arrangement according to claim 8 including a second detector connectible to the output of said phase discriminator and switching means connected to said second detector for disconnecting the output of said first detector from said evaluation device and for connecting said detector to said evaluation device.

10. A circuit arrangement according to claim 6 wherein said evaluation device is a display means which displays the transmission-level for indicating phase modulation disturbances.

* * * * *